United States Patent [19]
Lee et al.

[11] Patent Number: 6,139,993
[45] Date of Patent: Oct. 31, 2000

[54] PHOTOMASK DEFECT REPAIR METHOD

[75] Inventors: Kyung-hee Lee; Sung-woon Choi, both of Kyungki-do, Rep. of Korea

[73] Assignee: Samsung Electronics Co., Ltd., Rep. of Korea

[21] Appl. No.: 09/333,743

[22] Filed: Jun. 15, 1999

[30] Foreign Application Priority Data

Jun. 29, 1998 [KR] Rep. of Korea .................... 98-24992

[51] Int. Cl.⁷ ........................................... G03F 9/00
[52] U.S. Cl. ........................................... 430/5; 204/192.34
[58] Field of Search ................. 430/5, 322; 204/192.34; 250/492.2, 492.3; 216/66

[56] References Cited

U.S. PATENT DOCUMENTS 5,272,116 12/1993 Hosono ........................................ 430/5
6,030,730 2/2000 Smolinski ................................... 430/5

*Primary Examiner*—S. Rosasco
*Attorney, Agent, or Firm*—Skjerven Morrill MacPherson LLP; Don C. Lawrence

[57] ABSTRACT

A method of repairing a defect in a photomask minimizes the step difference between a defect-free portion and a repaired portion of the mask's substrate. The method comprises a two-step etch process: irradiating only the body of the defect on the substrate with a first dose of an ion beam to remove a part of the body, then simultaneously irradiating the entire light transmitting surface of the substrate including the body of the defect with a second dose of an ion beam until the body of the defect is completely removed from the substrate. The sum of the first dose and the second dose of the ion beam irradiation is equal to the single dose of irradiation with the ion beam that is necessary to remove the body of the defect from the substrate in a single irradiation therewith. The method further includes cleaning away any ion stain on the substrate after the two-step etch process.

10 Claims, 6 Drawing Sheets

PHOTOMASK DEFECT REPAIR METHOD

BACKGROUND OF THE INVENTION

1. Field of the Invention

The present invention relates to a method of fabricating a photomask, and more particularly, to a method of repairing a defect in a photomask.

2. Description of the Related Art

Photolithography is a critical process in the fabrication of integrated circuits. In particular, today's very high integration level of integrated circuit devices demands a highly reliable photolithography which employs a photomask that can define extremely fine patterns and that is defect-free. Typical pattern defects of a photomask include a "clear" defect and an "opaque" defect. The clear defect represents damage to a part of the pattern. The opaque defect occurs when debris of the light shielding or light phase-shifting material that forms the pattern is present on a light transmitting portion of the photomask.

The conventional method for repairing an opaque defect involves removing the debris of the pattern material by ion beam etching. However, this method frequently results in an undesirable recessed region R being formed on the mask substrate 10, as shown in FIG. 1, which shows a cross-section of a mask after an opaque defect in it has been repaired by the conventional ion beam etching repair process. The recessed region R, which is deeper than other portions of the substrate 10, is formed generally along the perimeter of the opaque defect, since the etch rate of the substrate 10 is substantially similar to that of the material forming the opaque defect. Reference numeral 12 refers to the mask pattern. In addition to the recessed region R, the conventional ion beam etching repair also produces "ion stains" around the repaired portion of substrate 10. The extra etching step necessary to remove the ion stains makes the recessed region R even deeper. A large step difference d, and the recessed region R of the substrate 10, cause a phase difference between the light transmitted by the normal portion of the substrate 10 and the light transmitted by the recessed region R of the substrate 10, thereby producing an error in the pattern reproduced on the work piece. Therefore, photolithography using a photomask that has been repaired by the conventional method can result in the production of defective parts.

SUMMARY OF THE INVENTION

In accordance with an embodiment of the present invention, a method of repairing a defect in a photomask minimizes the step difference between the normal portion and the repaired portion of a mask substrate. The method includes a two-step etch process. The two-step etch process comprises irradiating the foreign material on the substrate with a first dose of an ion beam to remove a part of the foreign material, and then irradiating the entire surface of the substrate, including the foreign material, with a second dose of ion beam to completely remove the foreign material, the sum of the first and second doses of irradiation being equal to the amount of irradiation necessary to completely remove the foreign material in a single dose of irradiation. The method further comprises cleaning away any ion stain remaining on the substrate after the two-step etch process.

BRIEF DESCRIPTION OF THE DRAWINGS

The various features and advantages of the present invention will become more apparent from a consideration of the detailed description of it below, together with a reference to the attached drawings, in which.

In the above drawings, the thicknesses of various films and regions are exaggerated for clarity. Also, use of the same reference symbols in different figures indicates similar or identical items.

DETAILED DESCRIPTION OF THE INVENTION

Figure 2:
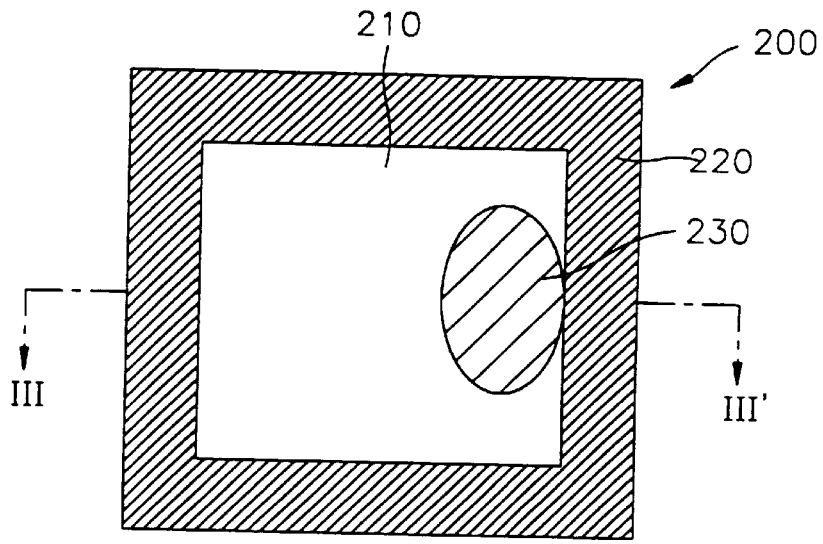
FIG. 2 is a plan view of a photomask having a defect.
Figure 3:
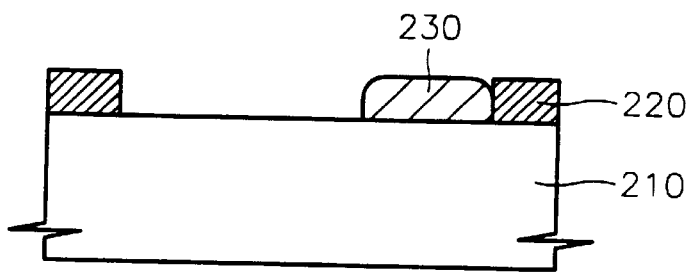
FIG. 3 is a cross-sectional view of the photomask taken along the line III–III' in FIG. 2.

With reference to FIGS. 2 and 3, a photomask 200 includes a photomask substrate 210 and a pattern 220 formed on the substrate 220. The portion of the substrate 210 that does not include a pattern 220 thereon is characterized as a light transmitting area of the substrate 210. The photomask substrate 210 is formed of a material which is transparent, e.g., quartz or glass. The pattern 220 is formed of a light shielding material when the photomask 200 is a typical photomask, or of a light phase-shifting material when the photomask 200 is a phase-shifting photomask. Materials having a light transmissivity of 5% or less, e.g., chrome, molybdenum and aluminum, are among the light-shielding materials, and CrO, CrON, CrOCN, MoSiO, MoSiON and $WSi_x$ are among the phase-shifting materials.

During fabrication of the photomask 200, a small particle of foreign materials can be deposited on the light transmitting area of mask 200 to form a defect 230. The defect 230 can be detected by a direct or an indirect comparison of the photomask 200 with a standard photomask. In the indirect method, a photoresist pattern is formed on a wafer using the photomask 200. A scanning electron microscopy compares the photoresist pattern formed from the photomask 200 with a photoresist pattern formed from a standard photomask to detect any defects in the photomask 200. The coordinates of the defects are recorded, and a repairing apparatus repairs the photomask 200 by removing the defects.

In contrast, the direct method does not involve forming a photoresist pattern to detect defects in the photomask in question. Rather, a detecting apparatus is used to directly scan the photomask for any defects in it, as described in more detail below. The detecting apparatus can be combined with a repairing apparatus, as shown in FIG. 4, or the detecting apparatus can be separate from the repairing apparatus.

Figure 4:
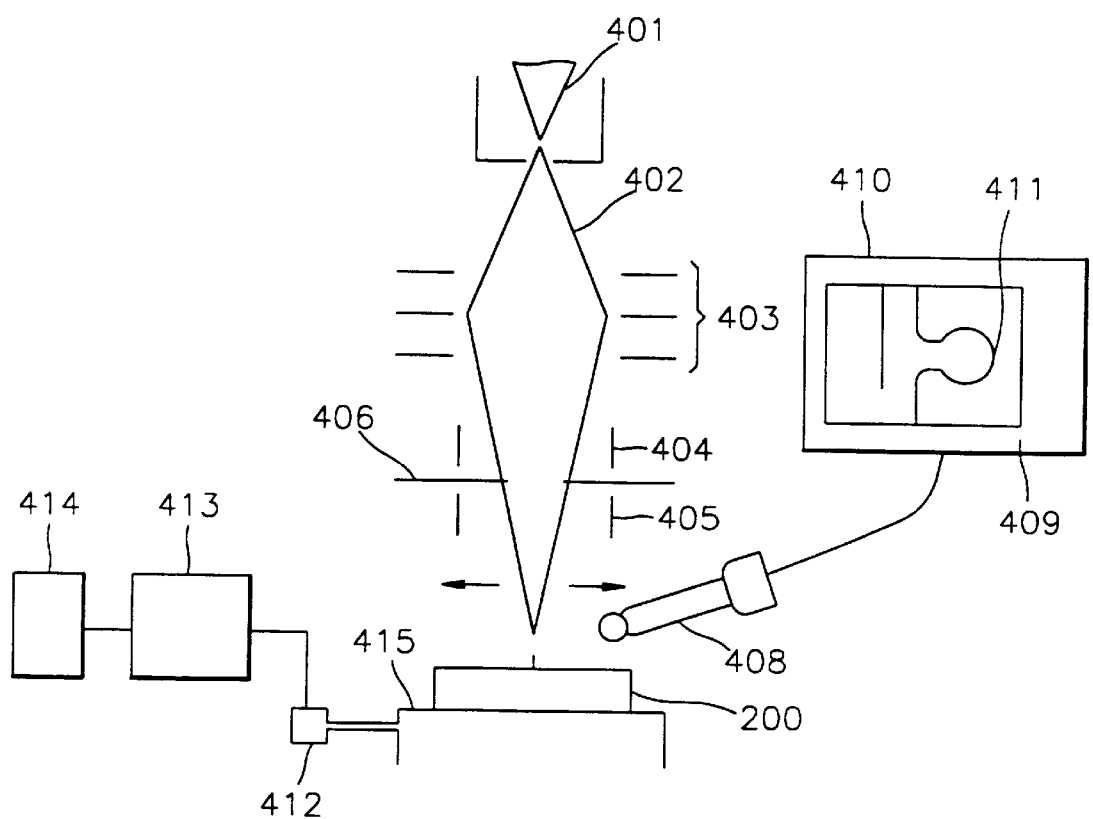
FIG. 4 is a schematic drawing of an ion beam etching apparatus used in a method of repairing a photomask according to an embodiment of the present invention.

Referring to FIG. 4, operation of the combined defect detecting and repairing apparatus is now explained. A metal ion source 401, e.g., a gallium (Ga) ion source, emits an ion beam 402, and an electrostatic lens 403 focuses the ion beam 402 emitted. Then, a combination of polarizing electrodes 404 and 405 and an aperture 406 directs the ion beam 402 onto a photomask 200 loaded on a programmably, moveable table 415 to scan the entire surface of the photomask 200. When it strikes the photomask 200, the ion beam 401 produces secondary charged particles (e.g., secondary electrons, secondary ions, etc.) that are emitted from the photomask 200 and captured by a detector 408. The captured secondary charged particles are processed to produce and display a scanned image 411 of the photomask 200 on a display 410.

The scanned image 411 is compared with a standard image stored in the apparatus to identify and locate any defects. Information about the defects, such as their location in the photomask 200, are stored in a memory 414. To repair the defects, a controller 413 reads the information stored in memory 414 and drives a motor 412 to move the table 415 on which the photomask 200 is loaded so that a focused ion beam can be irradiated on the defects.

Figure 5:
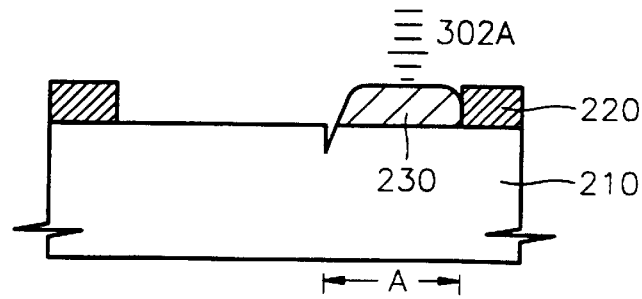
FIGS. 5 to 8 are step-by-step cross-sectional views of the photomask taken along the line III–III' in FIG. 2, illustrating a method of repairing the photomask according to an embodiment of the present invention.
Figure 6:
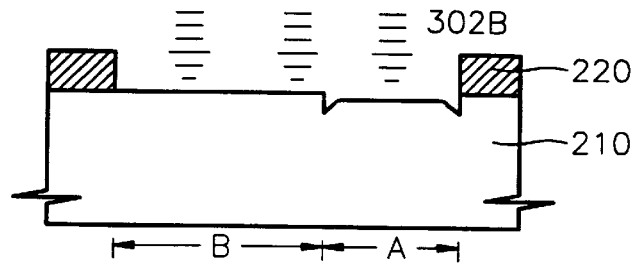

FIGS. 5 through 8 illustrate a method of repairing a defect in a photomask in accordance with the present invention. The method irradiates a focused ion beam, which is an ion beam shaped by an electromagnetic field, such as a focusing electromagnetic field or a collimating electromagnetic field, onto a defective photomask. Referring to FIG. 5, a total dose of the ion beam necessary to completely remove the defect 230 in the substrate 210 is determined. The total dose is proportional to the thickness of the defect 230 because, in general, the thickness of the defect 230 is the same or similar to that of the material of the pattern 220. Therefore, the thickness of the pattern 220 can be used as the parameter for determining the total dose necessary to remove the defect.

Then, a first dose of ion beam 302A, which is a fraction of the total dose as determined above, is irradiated onto the defect 230, and only on the area A of the defect 230 on the substrate 210, thereby partially removing defect 230 by ion beam etching.

Figure 1:
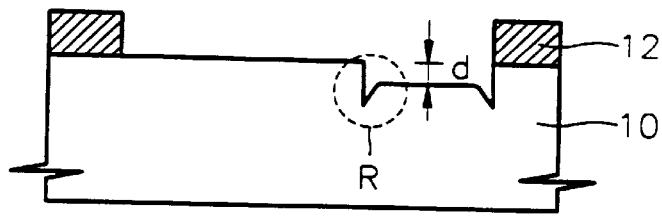
FIG. 1 is a cross-sectional view of a photomask in which a defect has been repaired by a conventional method.

After the first dose of irradiation is applied as above, a second dose of ion beam 302B, which is calculated by subtracting the first dose from the total dose determined as necessary, is irradiated upon the total light transmitting area of the substrate 210, including the defect area A, and the remaining, normal area B, thereby completely removing the defect 230 by ion beam etching. Since the second dose etches both the area A and the normal area B simultaneously, any step difference, or difference between the thickness of the substrate 210 in area (A) and in normal substrate area B will be less than that produced by the conventional repair method described above with reference to FIG. 1.

Figure 7:
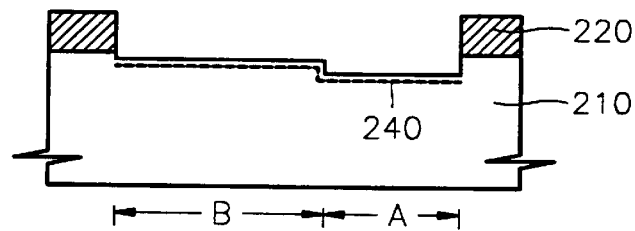

As shown in FIG. 7, any ion stain 240 formed on the substrate 210 during the ion beam etching procedure is removed by the application of a cleansing solution. In this procedure, the entire light transmitting area of the substrate 210 is etched to remove the ion stain 240.

Figure 8:
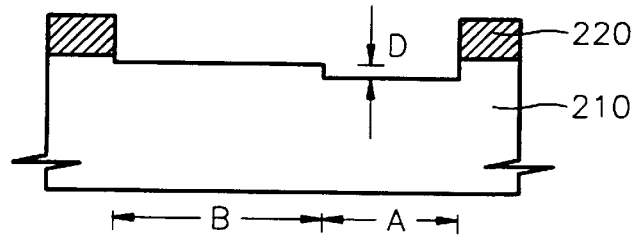

FIG. 8 shows a photomask that has gone through the first and second ion beam etching and the ion stain cleansing procedure. No recess is formed in the substrate 210 around the perimeter of the formerly present defect 230, and the step difference D between the area A that had the defect 230 on it and the normal substrate area B is smaller than that produced by the conventional method described above in connection with FIG. 1.

Thus, when the defect has an etching rate similar to that of the substrate, the first dose is determined such that the first ion beam etching will etch the defect down almost to the top surface of the substrate. Therefore, to minimize the resulting step difference, it is preferable that the first dose be more than the second dose. For example, when the defect is assumed to be 0.1 $\mu$m high by virtue of its presence in a pattern that is 0.1 $\mu$m thick, the first dose should be between about 0.35 nC/$\mu$m$^2$ and 0.4 nC/$\mu$m$^2$, and the second dose should then be between about 0.1 nC/$\mu$m$^2$ and 0.15 nC/$\mu$m$^2$.

Several experimental examples illustrate the application and performance of the repair method of the invention, and the performance of lithography conducted using a photomask repaired by the method.

Experiment 1

A first experiment was conducted to determine the effective amounts of the first and second doses. A 1000 Å thick chrome film pattern defining a contact hole having a critical size of 0.42 $\mu$m was formed on each of six quartz substrates. A defect made of the chrome film was formed on five of the substrates. An ion beam obtained from a gallium ion source was used for the repair, and various quantities of the first and second doses were employed to repair the defect, as shown in Table 1 below.

TABLE 1

| photomask | first dose (nC/$\mu$m$^2$) | second dose (nC/$\mu$m$^2$) |
|---|---|---|
| normal photomask | 0 | 0 |
| defective photomask | | |
| 1 | 0.1 | 0.4 |
| 2 | 0.2 | 0.3 |
| 3 | 0.3 | 0.2 |
| 4 | 0.35 | 0.15 |
| 5 | 0.4 | 0.1 |

Figure 9:
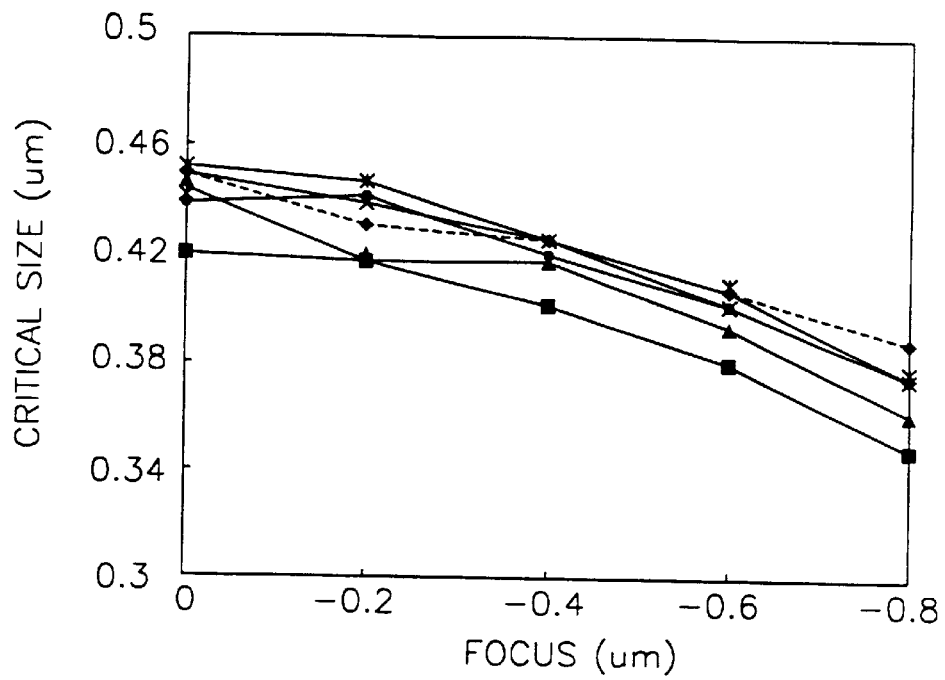
FIG. 9 is a graph showing contact hole sizes of photoresist patterns using photomasks repaired under various conditions by the method illustrated in FIGS. 5 to 8.

A 1 $\mu$m thick photoresist film was deposited on each of six wafers, and the photoresist films of the respective wafers were exposed and developed using the normal mask and the five photomasks repaired under the conditions shown in Table 1. The experiment used an i-line stepper (the number of apertures: 0.65, $\sigma$: 0.52) for the photolithography of the test contact hole at various foci of a light source: 0 $\mu$m, -0.2 $\mu$m, -0.4 $\mu$m, -0.6 $\mu$m, and -0.8 $\mu$m. FIG. 9 shows the measured sizes of the contact holes of the respective developed photoresist patterns using the above-described six photomasks. The symbol -♦- represents data points for the normal photomask, -■- datapoints for repaired mask no. 1, -▲- datapoints for repaired photomask no. 2, -×- datapoints for repaired photomask no. 3, -✻- datapoints for repaired mask no. 4, and -●- datapoints for the repaired mask no. 5.

The repaired masks 3, 4 and 5 produced contact holes having sizes similar to those of the contact hole produced by the normal mask. This result indicates that the defect is effectively repaired when the first dose is greater than the second dose, that is, when the first dose is between about 0.3 nC/$\mu$m$^2$ and 0.4 nC/$\mu$m$^2$, and the second dose is between about 0.1 nC/$\mu$m$^2$ and 0.2 nC/$\mu$m$^2$. In particular, the photomask repaired using a first dose of 0.35 nC/$\mu$m$^2$ and a second dose of 0.15 nC/$\mu$m$^2$ produced almost the same sized contact holes as the normal mask.

Experiment 2

Figure 10:
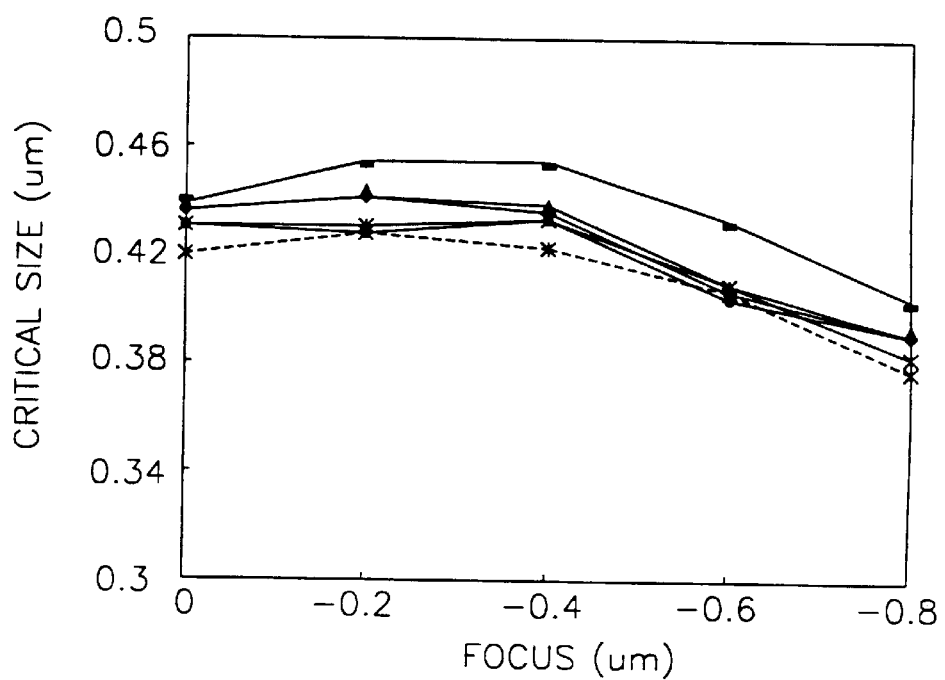
FIG. 10 is a graph showing contact hole sizes of photoresist patterns using photomasks repaired under the optimum condition by the method illustrated in FIGS. 5 to 8.

A second experiment was conducted to check the reproducibility of the repair method. Seven defective photomasks were prepared in the same way as in the first experiment above and were repaired by a first dose of 0.35 nC/$\mu$m$^2$ and a second dose of 0.15 nC/$\mu$m$^2$. Other conditions, such as the contact hole size and the photolithography conditions, were the same as in the first experiment. Measured contact hole sizes of photoresist patterns are shown in FIG. 10. The graph of this figure demonstrates that the repair method of this invention produces consistent, reproducible results that are effective in repairing photomask defects.

Experiment 3

A third experiment involved comparing the efficacy of the two-step method of the present invention with that of the conventional, single step repair method. The step difference between the repaired defective substrate area and the normal substrate area was measured. When a defective photomask was repaired by the method of this invention using a first dose of 0.35 nC/$\mu$m$^2$, followed by a second dose of 0.15 nC/$\mu$m$^2$, the step difference was about 300 Å. The 300Å step difference causes a phase difference of about 22.5° between the light transmitted by the repaired defective substrate area and that transmitted by the normal substrate area. When, in accordance with the conventional method, the defective photomask was repaired by a single dose of 0.5 nC/$\mu$m$^2$ applied only to the defective portion, the step difference was about 540 Å. The 540 Å step difference causes a phase difference of about 45° between the light transmitted by the repaired defective substrate area and that transmitted by the normal substrate area. A phase difference of this magnitude is unacceptable for photolithography purposes, because it is incapable of accurately transcribing a pattern to a photoresist surface.

Figure 11A:
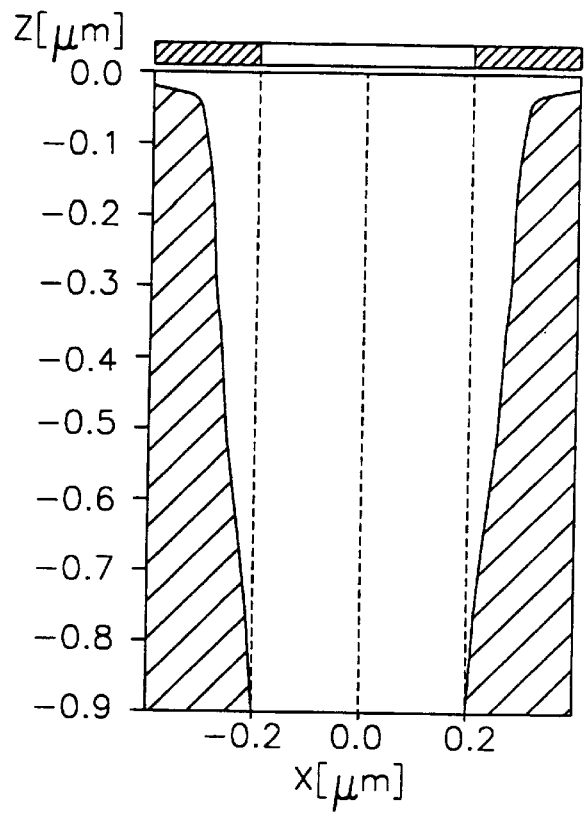
FIG. 11A is a cross-sectional view of a contact hole of a photoresist pattern formed using a normal photomask.
Figure 11B:
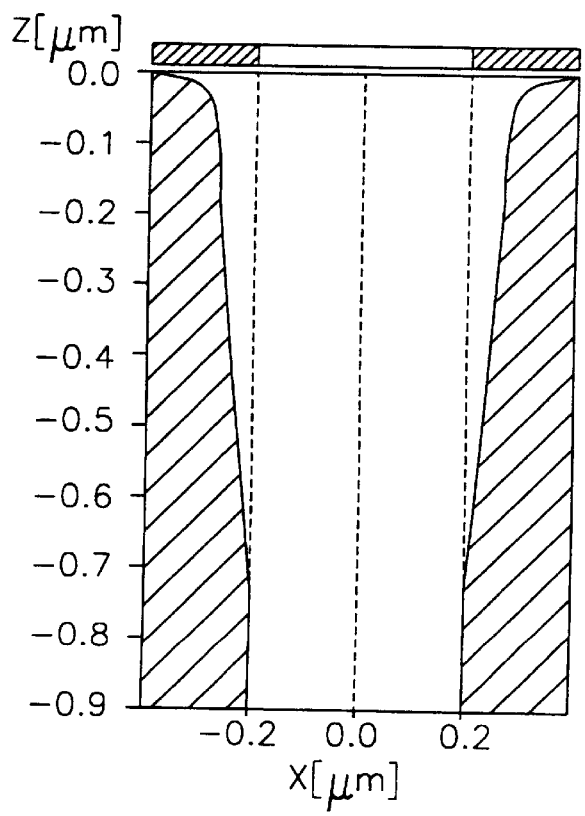
FIG. 11B is a cross-sectional view of a contact hole of a photoresist pattern formed using a photomask repaired by a method in accordance with an embodiment of the present invention; and, FIG. 11C is a cross-sectional view of a contact hole of a photoresist pattern formed using a photomask repaired by a conventional method.
Figure 11C:
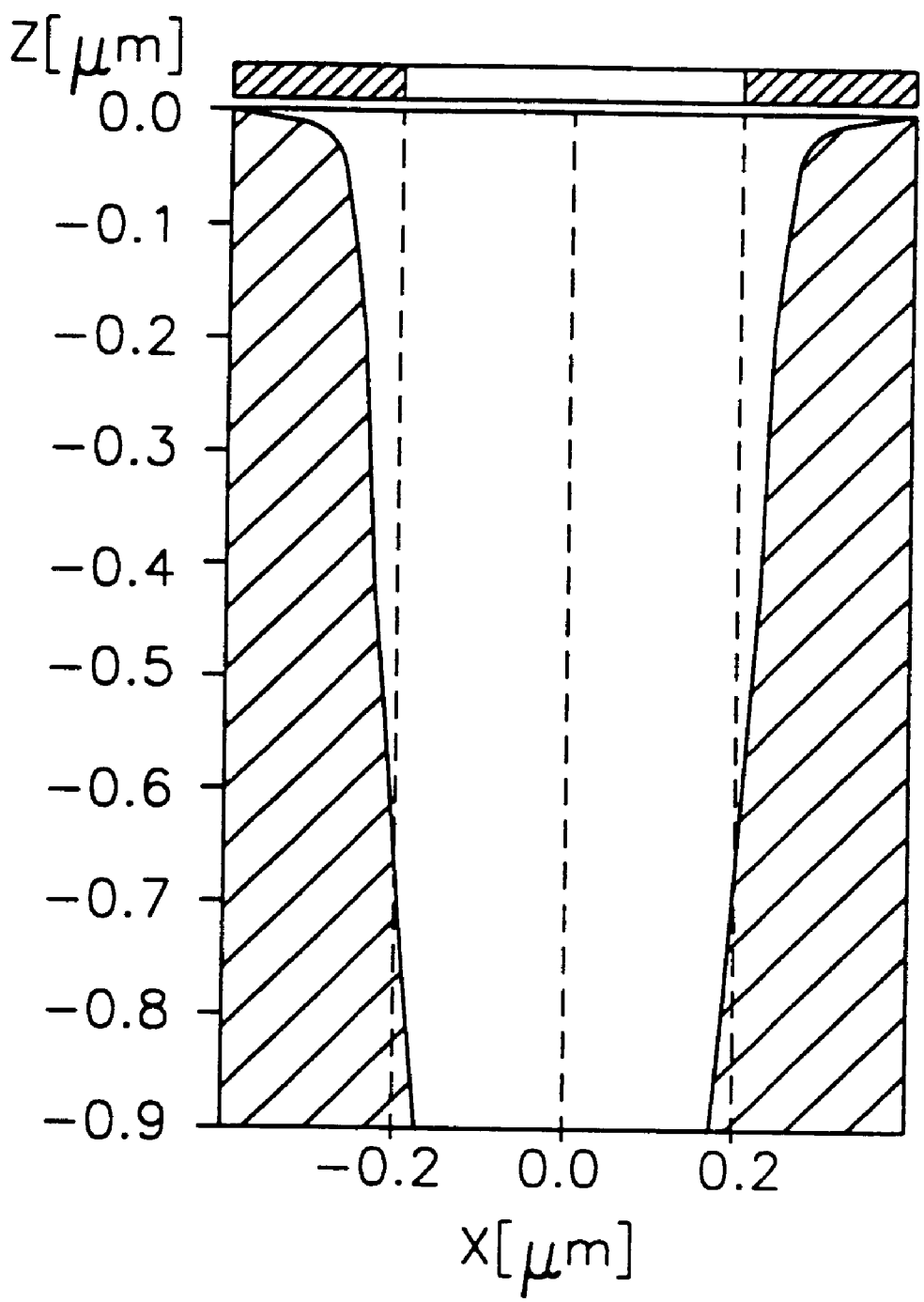

In addition, the above described two photomasks and a normal photomask were used in forming photoresist patterns of contact holes in the same manner as was done in the first experiment. The contact hole sizes produced in the photoresist patterns were then measured, and the results compared, as shown in Table 2 below, and in FIGS. 11A to 11C, which show the cross-sections defined by each of the photoresist patterns. In Table 2, A denotes the normal, or defect-free, mask, B denotes the mask repaired according to the present invention, and C denotes the mask repaired by the conventional method.

TABLE 2

| Photomask | Critical size (Fm) of the upper portion of contact hole | Critical size (Fm) of the lower portion of contact hole | Mean inclination (E) of sidewall of contact hole |
| --- | --- | --- | --- |
| A | 0.532 | 0.401 | 84.358 |
| B | 0.530 | 0.399 | 83.973 |
| C | 0.519 | 0.344 | 82.501 |

As may be seen from the data, the photomask B, repaired by the method of the present invention, produced a contact hole almost identical to that produced by the normal photomask A.

As amply illustrated by the experiments, the two-step photomask repair method of the present invention produces results that are superior to those of the conventional single step repair method.

Although the invention has been described with reference to particular embodiments and examples thereof, such description is only exemplary of the inventors' application and should not be taken in any limiting sense. Thus, various adaptations, combinations, and modifications of the features and methods of the embodiments disclosed are also within the scope of the invention, as defined by the following claims.

What is claimed is:

1. A method of repairing a defect in a photomask of the type comprising a substrate and a pattern formed thereon, the defect comprising a body of material situated in a light transmitting area of the substrate, the light transmitting area comprising a portion of the substrate that does not have a light-shielding or phase-shifting portion of the pattern situated thereon, the method comprising:

irradiating only the body of material with a first dose of an ion beam to remove a part of the body from the substrate; and, irradiating both the body of material and the light transmitting area of the substrate simultaneously with a second dose of an ion beam until the body of material is completely removed from the substrate.

2. The method of claim 1, wherein the sum of the first dose and the second dose is equal to the single dose of an ion beam necessary to completely remove the body of material from the substrate in a single irradiation therewith.

3. The method of claim 1, wherein the ion beam is generated by a gallium ion source.

4. The method of claim 1, further comprising cleaning the photomask with a cleaning solution to remove any ion stain existing on the substrate after the second dose of irradiation.

5. The method of claim 1, wherein the first dose is larger than the second dose.

6. The method of claim 1, wherein the material of the body comprises a material of the pattern.

7. The method of claim 6, wherein the material of the pattern comprises a light-shielding material.

8. The method of claim 7, wherein the light shielding material comprises chrome, molybdenum or aluminum.

9. The method of claim 6, wherein the material of the pattern comprises a phase-shifting material.

10. The method of claim 9, wherein the phase-shifting material comprises CrO, CrON, CrOCN, MoSiO, MoSiON or WSi$_x$.

* * * * *